United States Patent [19]
Oh

[11] Patent Number: 5,138,577
[45] Date of Patent: Aug. 11, 1992

[54] LATCHING CIRCUIT FOR SENSE AMPLIFIER IN A DRAM AND DRAM UTILIZING THE LATCHING CIRCUIT

[75] Inventor: Jong H. Oh, Kyungki, Rep. of Korea

[73] Assignee: Hyundai Electronics Industries Co., Ltd., Kyungki, Rep. of Korea

[21] Appl. No.: 578,895

[22] Filed: Sep. 6, 1990

[30] Foreign Application Priority Data

Sep. 8, 1989 [KR] Rep. of Korea ............... 89-12997

[51] Int. Cl.$^5$ .................................................. G11C 7/00
[52] U.S. Cl. .............................. 365/189.05; 365/205; 365/207; 365/208
[58] Field of Search ............... 365/189.05, 207, 208, 365/205

[56] References Cited
U.S. PATENT DOCUMENTS 5,003,513 3/1991 Porter et al. ............... 365/189.05

Primary Examiner—Joseph E. Clawson, Jr.
Attorney, Agent, or Firm—Merchant, Gould, Smith, Edell, Welter & Schmidt

[57] ABSTRACT

A latching circuit for sense amplifier in a DRAM for gradually decrease the potential level at the latching point, that is, $\phi S$ node of N-channel sense amplifying unit of the sense amplifier from the potential level which is lower than that of bit line charging voltage to the potential level of the ground, when a sensing operation of the sense amplifier is enabled, is disclosed. The latching circuit for sense amplifier further comprises a Schmitt trigger circuit for preventing the previous enabling of the sensing operation of the sense amplifier from occurring before data signal from the selected memory cell of the memory cell array apparatus in the DRAM is transferred to 0-bit line B0. A DRAM comprising the latching circuit for sense amplifier and the Schmitt trigger circuit, is also disclosed.

10 Claims, 3 Drawing Sheets

F I G. 2A
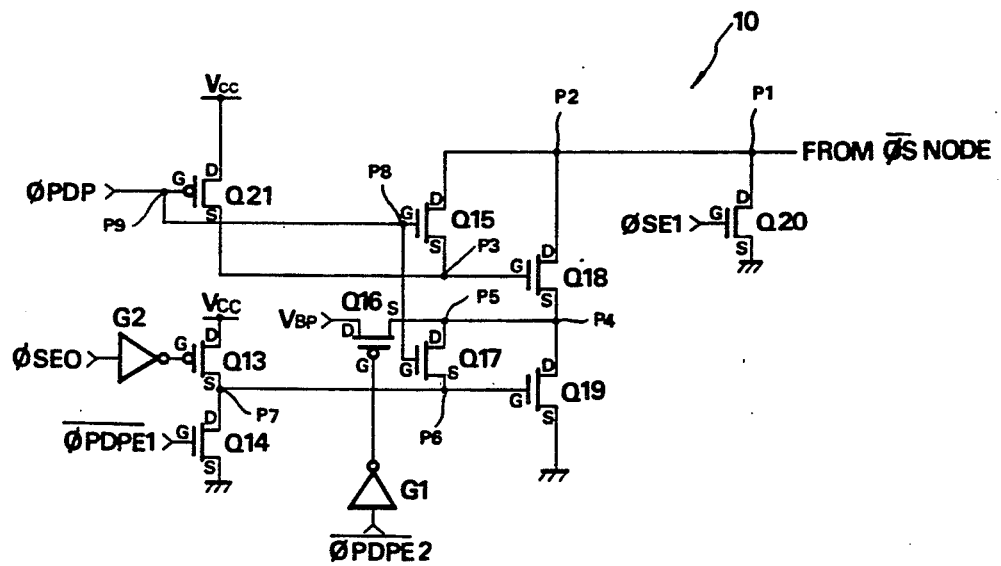
F I G. 2B
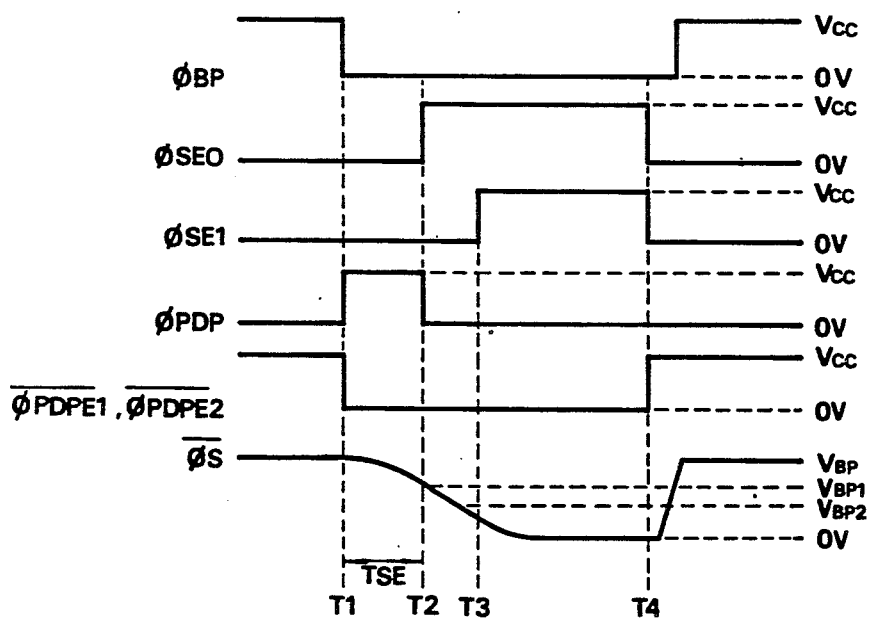

LATCHING CIRCUIT FOR SENSE AMPLIFIER IN A DRAM AND DRAM UTILIZING THE LATCHING CIRCUIT

BACKGROUND OF THE INVENTION

FIELD OF THE INVENTION

This invention relates to a latching circuit for sense amplifier in a DRAM (Dynamic RAM) and a DRAM utilizing the latching circuit, and more particularly, to a latching circuit for sense amplifier in a DRAM and a DRAM utilizing the latching circuit in which by decreasing the voltage level at the latching point of the latching circuit from the voltage level in its initial floating state to the voltage level which is lower than that of the bit line charging voltage, prior to being active of the latching control signal supplied to the latching circuit, a bit line sensing operation is enabled just after a latching control signal supplied to the latching circuit is active.

INFORMATION DISCLOSURE STATEMENT

Generally, in a DRAM, 0-bit line and 1-bit line which are charged by a bit line charging voltage are separated from a bit line charging voltage source in order to sense information data stored in a memory cell.

Thereafter, information data stored in a memory cell is sensed by decreasing the potential level at the latching point of the latching circuit for sense amplifier from the bit line charging potential level to the ground potential level. Therefore, in the initial state of the sensing operation of a sense amplifier, the potential at the latching point is decreased to the threshold voltage of the two MOSFETs which are cross-coupled each other, and the latching control signal circuit supplied to the latching circuit, should then be fully active. However, according to the prior art latching circuit for sense amplifier in the DRAM, since the sensing time of the sense amplifier is increased and the potential at the latching point is instantaneously decreased to the ground potential, there is a disadvantage in that the sense amplifier rather senses a charge than a voltage due to the initial induction of the rapid sensing operation.

Therefore, it is an object of present invention to provide a latching circuit for sense amplifier in a DRAM and a DRAM utilizing the latching circuit for sense amplifier, which enhances the stability of the sensing operation and the sensitivity of the sensing operation, in order to avoid the disadvantage set forth above.

The preceding objects should be construed as merely presenting the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A latching circuit for sense amplifier in a DRAM and DRAM utilizing the latching circuit of the present invention is defined by the claims with a specific embodiment shown in the attached drawings. For the purpose of summarizing the invention, the invention relates to a DRAM comprising a bit line charging voltage source for supplying a bit line charging voltage to the 0-bit line B0 and the 1-bit line B1 and to the $\overline{\phi S}$ and $\phi R$ nodes. A memory cell array apparatus having a plurality of memory cells arranged in the memory cell array apparatus and with a 0-bit line B0 and 1-bit line B1 formed therein, is utilized. An equivalent circuit controls a 0-bit line B0 level and a 1-bit line B1 level such that these levels are the same in response to a bit line charging control signal $\phi BP$ applied to the equivalent circuit. A sense amplifier is provided with an N-channel sense amplifying unit having an $\overline{\phi S}$ node, which is connected from the 0-bit line B0 of the memory cell array apparatus and a P-channel sense amplifying unit having an $\phi R$ node, which is connected from the 1-bit line B1 of the memory cell array apparatus, for sensing date signal corresponding to a memory cell selected from the plurality of memory cells arranged in the memory cell array apparatus. A MOSFET Q10 having a drain electrode connected to the $\phi R$ node, a source electrode connected to a voltage source Vcc and a gate electrode connected to receive a latching control signal $\phi SP$ is used. A MOSFET Q12 having a drain electrode connected to the $\overline{\phi S}$ node, a source electrode connected to the $\phi R$ node of the P-channel sense amplifying unit and a gate electrode connected to receive the bit line charging control signal $\phi BP$ is utilized. A MOSFET Q5 having a source electrode connected to the $\phi R$ node, a drain electrode connected to the bit line charging voltage source and a gate electrode connected to receive the bit line charging control signal $\phi BP$ is employed. A latching means for sense amplifier is connected to the $\overline{\phi S}$ node of the N-channel sense amplifying unit for gradually decreasing the potential level at the $\overline{\phi S}$ node from the potential level which is lower than that of the bit line charging voltage to the potential level of a ground when a sense operation is enabled.

The latching means for sense amplifier according to the invention may further include a MOSFET Q20 having a drain electrode connected, by way of a junction P1, to the $\phi S$ node of the N-channel sense amplifying unit, a source electrode connected to the ground, and a gate electrode connected to receive a latching control signal $\phi SE1$. A MOSFET Q18 having a drain electrode connected, by way of a junction P2 and the junction P1, to the $\overline{\phi S}$ node of the N-channel sense amplifying unit, a source electrode connected to a junction P4, and a gate electrode connected to a junction P3 is used. A MOSFET Q19 having a drain electrode connected to the junction P4, thereby connecting the MOSFETs Q18 and Q19 in series, a source electrode connected to the ground, and a gate electrode connected to a junction P6 is also employed. A MOSFET Q15 having a drain electrode connected, via the junctions P2 and P1, to the $\overline{\phi S}$ node of the N-channel sense amplifying unit, a source electrode connected to the junction P3, and a gate electrode connected to a junction P8 is utilized. A MOSFET Q17 having a drain electrode connected to a junction P5 which is connected to the junction P4, a source electrode connected to the junction P6, and a gate electrode connected to the junction P8 is used. A MOSFET Q16 having a drain electrode connected to the bit line charging voltage source, a source electrode connected to the junction P5, and a gate electrode connected to through a NOT gate G1 to receive a latching control signal $\overline{\phi PDPE2}$ is also utilized. Also used is a MOSFET Q21 having a drain electrode connected to the voltage source Vcc, a source electrode connected to the junction P3, and a gate electrode connected, through a junction P9 which is connected to the junction P8, to receive a latching control signal $\phi$PDP, such that, in use, the MOSFETs Q15 and Q17 or the MOSFET Q21 turn on or off depending upon the latching control signal $\phi$PDP being applied to their gate electrodes. A MOSFET Q13 having a drain electrode connected to the voltage source Vcc, a source electrode connected to a junction P7 which is connected to the junction P6, and a gate electrode connected through a NOT gate G2 to receive a latching control signal $\phi$SE0 is employed such that, in use, the MOSFET Q13 and MOSFET Q16 turn on or off depending upon the latching control signal $\phi$SE0 and the latching control signal $\overline{\phi PDPE2}$, respectively, applied through each the respective NOT gate G2 and G1. A MOSFET Q14 having a drain electrode connected to the junction P7, a source electrode connected to the ground, and a gate electrode connected to receive a latching control signal $\phi$PDPE1 is used, such that, in use, the MOSFET Q14 and MOSFET Q20 turn on or off depending upon the latching control signal $\overline{\phi PDPE1}$ and the latching control signal $\phi$SE1, respectively, applied to the gate electrode of the MOSFET Q14 and the MOSFET Q20, respectively.

The MOSFETs Q5, Q12,, Q14, Q15, Q17, Q18, Q19 and Q20 are, preferably, N-channel MOSFETs, and the MOSFETs Q10, Q13, Q16 and Q21 are, preferably, P-channel MOSFETs, respectively.

The latching circuit for sense amplifier according to the present invention may further include a Schmitt trigger circuit having a first and a second input, with the first input connected to the $\overline{\phi S}$ node of the N-channel sense amplifying unit and the second input connected via the junction P9 to the gate electrode of the MOSFET Q21 to receive the latching control signal $\phi$PDP, and an output connected to the gate electrode of the MOSFET Q14 to supply an output signal $\overline{\phi DS}$ of the Schmitt trigger circuit to the MOSFET Q14.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

FIG. 2A is a latching circuit for sense amplifier of a DRAM according to the present invention.

FIG. 2B is voltage wave forms for illustrating the operation of the latching circuit for sense amplifier of the DRAM illustrated in FIG. 2A.

Figure 1A:
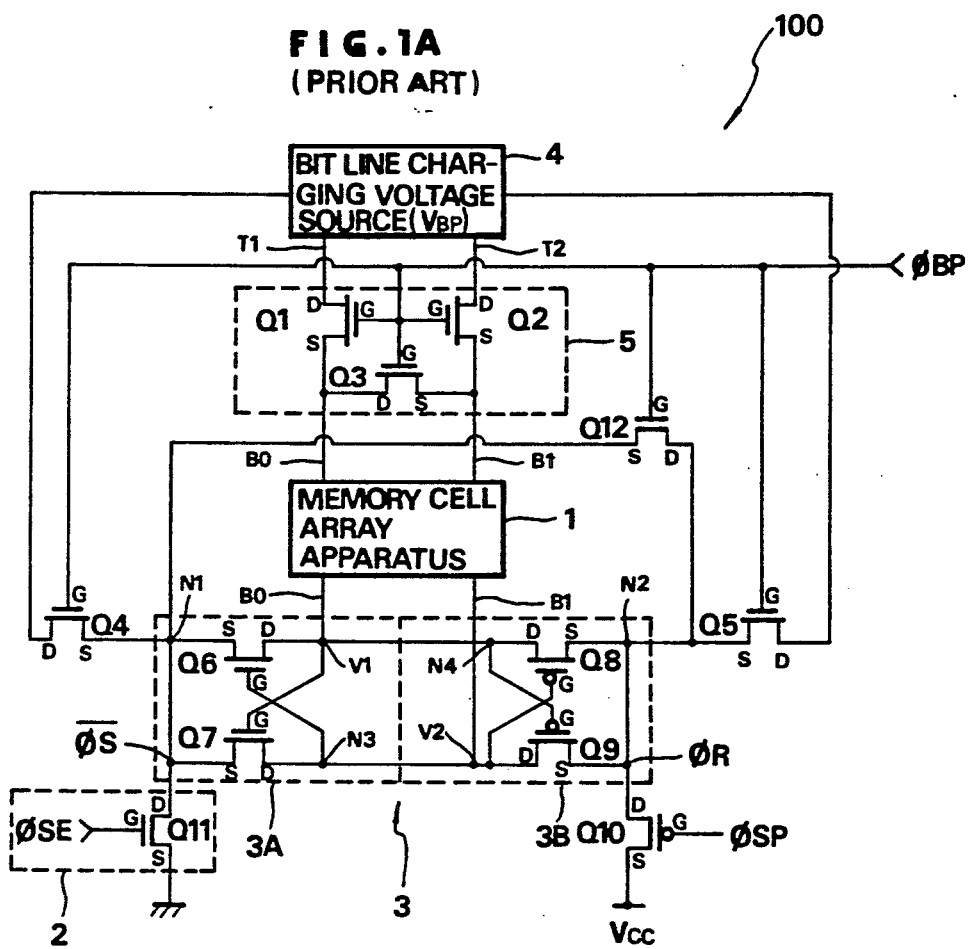
FIG. 1A is a diagram of a DRAM according to the prior art.

The novel feature of the present invention may be understood from the accompanying description when taken in conjunction with the accompanying drawings.

Similar reference characters refer to similar parts throughout the several views of the drawings.

DETAILED DESCRIPTION OF THE INVENTION

FIG. 1A illustrates a diagram of a prior art DRAM 100. It is noted that the N-MOSFET and P-MOSFET described hereinafter represent N-channel MOSFET and P-channel MOSFET, respectively.

A bit line charging voltage source 4 supplies the desired bit line charging voltage to a 0-bit line and 1-bit line, B0 and B1, $\overline{\phi S}$ and $\phi$R node, which will be described hereinafter. The bit line charging voltage source 4 is connected, through a T1 and T2 terminal formed therein, to an equivalent circuit 5. The equivalent circuit 5 is connected, via N-MOSFETs Q1 and Q2 formed therein through the 0-bit line B0 and 1-bit line B1 formed therein, to a memory cell array apparatus in which the memory cell array apparatus 1 comprises a plurality of memory cells arranged therein. The gate electrode of the N-MOSFET Q3 is connected to a junction between the source electrodes of the N-MOSFETs Q1 and Q2 of the equivalent circuit 5 to thereby connect all the gate electrodes thereof to each other so that a bit line charging control signal $\phi$BP is supplied their gate electrodes. Therefore, the equivalent circuit 5 makes a potential level of the 0-bit line B0 and 1-bit line B1, formed therein, the same. The 0-bit line B0 of the memory cell array apparatus 1 is connected both to the V1 node of a N-channel sense amplifying unit 3A of a sense amplifier 3 in which N-MOSFETs Q6 and Q7 are cross coupled to each other, and to the N4 node of a P-channel sense amplifying unit 3B in which P-MOSFETs Q8 and Q9 are cross coupled to each other.

In the N-channel sense amplifying unit 3A, the drain electrode of the N-MOSFET Q6 is connected to, through the V1 node, the 0-bit line B0 of the memory cell array apparatus 1 and to the gate electrode of the N-MOSFET Q7. Furthermore, the gate electrode and source electrode of the N-MOSFET Q6 are connected, through the N3 node, to the drain electrode and, through the N1 node and $\overline{\phi S}$ node, to source electrode of the N-MOSFET Q7, respectively.

In the P channel sense amplifying unit 3B, the gate electrode of the P-MOSFET Q8 is connected, through the V2 node, to the 1-bit line B1 of the memory cell array apparatus 1 and to the drain electrode of the P-MOSFET Q9. Furthermore, the drain electrode and source electrode of the P-MOSFET Q8 are connected, through the N4 node, to the gate electrode and, through the N2 node and $\phi$R node, to source electrode of the P-MOSFET Q9, respectively.

The 1-bit line B1 of the memory cell array apparatus 1 is connected both to the V2 node of the P-channel sense amplifying unit 3B of the sense amplifier 3 in which the P-MOSFETs Q8 and Q9 are cross coupled to each other, and to the N3 node of the N-channel sense amplifying unit 3A in which the N-MOSFETs Q6 and Q7 are cross coupled to each other. The N-MOSFET Q12 is connected between N-channel sense amplifying unit 3A and the P-channel sense amplifying unit 3B of the sense amplifier 3 through the N1 node and the N2 node. The N1 node is formed on the source electrode of the N-MOSFET Q6 of the N-channel sense amplifying unit 3A. The N2 node is formed on the source electrode of the P-MOSFET Q8 of the P-channel sense amplifying unit 7.

The N1 node and N2 node of the sense amplifier 3 are connected, through the N-MOSFETs Q4 and Q5, to the bit line charging voltage source 4 in order to supply the bit line charge voltage VBP thereto. The N1 node of the N-channel sense amplifying unit 3A of the sense amplifier 3 is connected via N-MOSFET Q11 of a latching circuit 2, through the 0S node formed at the source electrode of the N-MOSFET Q7, to the ground. The N2 node of the P-channel sense amplifying unit 3B is connected via the P-MOSFET Q10, through the $\phi$R node formed on the source electrode of the P-MOSFET Q9, to the electrode of the voltage supply source Vcc, respectively.

The latching control signal $\phi$SE is supplied to the gate electrode of the N-MOSFET Q11 of the latching circuit 2, and the latching control signal $\phi$SP is supplied to the gate electrode of the P-MOSFET Q10. Therefore, the N-MOSFET Q11 and P-MOSFET Q10 turn on or off depending upon the latching control signal $\phi$SE and $\phi$SP applied to their gate electrodes, respectively. Also each gate electrode of the N-MOSFETs Q1, Q2, Q3, Q4, Q5 and Q12 is connected to each other to receive the bit line charging control signal $\phi$BP. Thus, the turning N-MOSFETs Q1, Q2, Q3, Q4, Q5 and Q12 on or off depends upon the bit line charging control signal $\phi$BP applied to their each gate electrode, respectively.

The bit line charging voltage source 4 makes 0-bit line and 1-bit lines B0, B1 and $\phi$S, $\phi$R node level to a bit line charging potential level VBP depending upon the bit line charging control signal $\phi$BP supplied to their each gate electrode of the N-MOSFETs Q1, Q2, Q3, Q4, Q5 and Q12. Thereafter, upon the selection signal of a word line, not shown in drawings, if a certain memory cell is selected from a plurality of the memory cells arranged in the memory cell array apparatus 1, data signal stored in the selected memory cell is reached at the V1 node and V2 node of the sense amplifier 3 through the 0-bit line B0 and 1-bit line B1. For example, assuming that the potential level of the V2 node has the potential level higher than that of V1 node by DELTA V voltage, N-MOSFET Q6 turns on, so that, when the latching control signal $\phi$SE applied to the gate electrode of the N-MOSFET Q11 of the latching circuit 2 is "high" level, the potential level of the V1 node becomes a ground potential level. At the same time, the P-MOSFET Q9 turns on, so that, when the latching control signal $\phi$SP supplied to the gate electrode of the P-MOSFET Q10 is "low" level, the potential level of the V2 node becomes the Vcc potential level of the voltage source Vcc. Accordingly, the sensing operation of the sense amplifier 3 to sense "1" and "0" is possible.

Figure 1B:
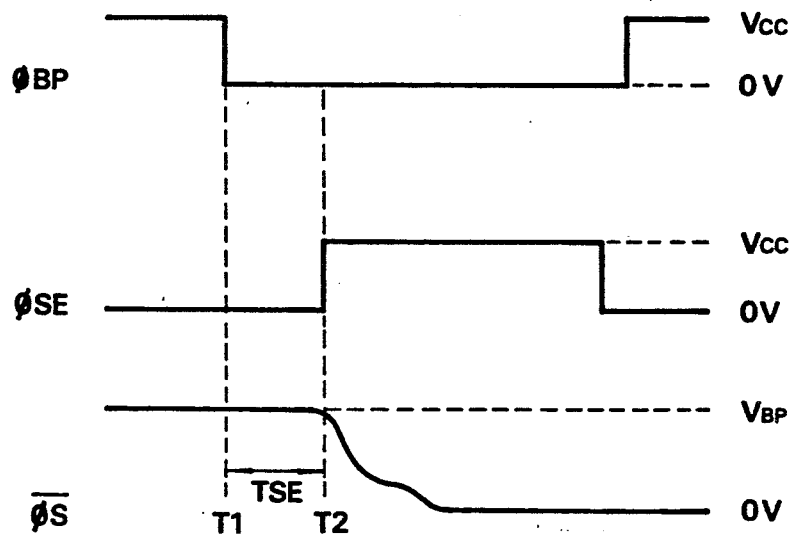
FIG. 1B is voltage wave forms for illustrating the operation illustrated in FIG. 1A.

Next, the potential variance of the $\overline{\phi S}$ node according to the latching control signal will be described as follows. In FIG. 1B, before the time T1, the $\overline{\phi S}$ node maintains in logic "high" state. Thereafter, after time T1 and T2, when the bit line charging control signal $\phi$BP is shifted in logic "low" state and the latching control signal $\phi$SE is then shifted in logic "high" state, the potential level of the $\overline{\phi S}$ node gradually decreases to "0" level, so that the 0-bit line B0 of the memory cell array apparatus 1 becomes "0" volt. Therefore, according to the prior art apparatus as illustrated in FIG. 1, a disadvantage exists in that the sensing time of the sense amplifier 3 increases as described above.

Accordingly, the present invention relates to the art, after time T2, for decreasing the potential level of the $\overline{\phi S}$ node to the potential level of the ground after previously decreasing the potential level of the $\phi$S node to the potential level lower than the bit line charging potential level.

FIG. 2A illustrates a latching circuit 10 for sense amplifier of the DRAM according to the present invention, the structure of which will be described in conjunction with the FIG. 1A and FIG. 2B.

Referring again to FIG. 1A, N-MOSFET Q4 is eliminated from the prior art DRAM and the latching circuit 10 according to the present invention at FIG. 2A is substituted for the latching circuit 2 connected to the $\phi$S node shown in FIG. 1A.

The construction of the latching circuit 10 according to the present invention will be described. The drain electrode of a N-MOSFET Q20, which turns on or off depending upon the control signal $\phi$SE1 supplied to the gate electrode thereof, is connected, through the junction P1, to the $\overline{\phi S}$ node of N-channel sense amplifying unit 3A of the sense amplifier 3 in FIG. 1A. The source electrode of N-MOSFET Q20 is connected to the ground. The $\overline{\phi S}$ node is connected, through the junction P2, via N-MOSFETs Q18 and Q19 with the source and drain electrode of each connected in series at the series junction P4, to the ground. Also, the gate electrode of the N-MOSFET Q18 is connected in feed back to the $\overline{\phi S}$ node through the junction P3, via N-MOSFET Q15 with the source electrode of the N-MOSFET Q15 being connected to the junction P3. The gate electrode of the N-MOSFET Q19 is connected to the series junction P7 which also connects the source electrode of the P-MOSFET Q13 with the drain electrode of the N-MOSFET Q14. The drain electrode of the P-MOSFET Q13 is connected to the voltage source Vcc. The source electrode of the N-MOSFET Q14 is connected to the ground. The source electrode of N-MOSFET Q17 is connected at the junction P6 which also connects the gate electrode of the N-MOSFET Q19. The drain electrode of N-MOSFET Q17 is connected at the junction P5 which is also connected to the series junction P4 which is positioned between the N-MOSFETs Q18 and Q19. In order for the gate electrode of the N-MOSFET Q17 to receive the latching control signal $\phi$PDP, the gate electrode of the N-MOSFET Q17 is connected, through the junction P8 and P9, to the gate electrode of the N-MOSFET Q15 and the gate electrode of the P-MOSFET Q21, respectively. The source electrode of the P-MOSFET Q16 is connected to the junction P5. The latching control signal $\overline{\phi PDPE2}$ is supplied, via the NOT gate G1, to the gate electrode of the P-MOSFET Q16, thereby supplying the bit line charging voltage VBP to the drain electrode thereof depending upon the latching control signal $\phi$PDPE2 applied to the gate electrode of the P-MOSFET Q16.

The latching control signal $\phi$PDP is supplied to thereby turn either the P-MOSFET Q21 on, when the latching control signal is a logic "low" level, or the N-MOSFETs Q15 and Q17, when the latching control signal is a logic "high" level on, depending upon the latching control signal $\phi$PDP applied to the gate electrode of the P-MOSFET Q21. The latching control signal $\phi$SE0 is supplied, through NOT gate G2, to the gate electrode of the P-MOSFET Q13 and the latching control signal $\overline{\phi PDPE1}$ is supplied to the gate electrode of the N-MOSFET Q14, respectively. Thus, the P-MOSFET Q13 and N-MOSFET Q14 turn on or off depending upon the each latching control signal $\phi$SE0 and $\overline{\phi PDPE1}$ applied to their respective gate electrodes.

The operation of the latching circuit according to the structure will be described.

Referring to FIG. 2B, at T1, the potential level of the $\phi$S node initially decreases from the potential level of the bit line charging control voltage VBP. At T2, the potential level of the $\phi$S node decreases from the potential level of the sum of the threshold voltage of the N-MOSFETs Q18 and Q19. At T3, the potential level of the $\overline{\phi S}$ node is further decreasing toward the potential level of the ground. At T4, the potential level of the $\phi$S node reaches and is maintained at the potential level of the ground.

In FIG. 2B, before the time T1, the P-MOSFETs Q21 and Q16 and N-MOSFET Q18 turn on, so that the potential of the $\overline{\phi S}$ node is the same as that of the bit line charging potential VBP (=Vcc/2) which is described in conjunction with FIG. 1B. Also, assuming that the bit line charging control signal $\phi$BP is shifted in logic "low" state, as shown in the drawing, during the time interval T1 to T2, that is, the TSE interval, if the P-MOSFET Q13 and N-MOSFET Q14 turn off depending upon each the respective latching control signal $\phi$SE0 and $\overline{\phi PDPE1}$, and N-MOSFETs Q15 and Q17 turn on, respectively, depending upon the latching control signal $\phi$PDP, as shown in FIG. 2B, N-MOSFETs Q18 and Q19 are operated as a diode, and the potential of the $\overline{\phi S}$ node is then decreased to the sum (VBP1) of the threshold voltage of the N-MOSFETs Q18 and Q19 since the latching control signal $\overline{\phi PDPE2}$ which is supplied, through the NOT gate G1, to the gate electrode of the P-MOSFET Q16 is in logic "low" state. Next, during the time interval T2 to T3, if the N-MOSFETs Q15 and Q17 turn off and the P-MOSFETs Q21 and Q13 turn on, the $\overline{\phi S}$ node potential level is then decreased from the potential level VBP1 to the potential level VBP2. Next, during the time interval T3 to T4, if the latching control signal $\phi$SE1 becomes the state of the voltage source level, N-MOSFET Q20 turn on, so that $\phi$S node potential level is decreased to "0" V. Consequently, the full sensing operation is accomplished.

Figure 3A:
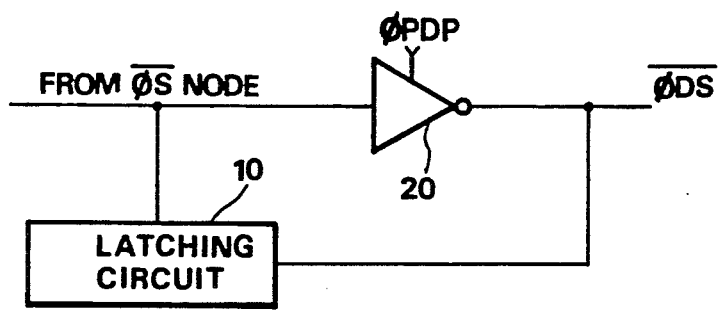
FIG. 3A illustrates an example of the latching circuit according to the invention.
Figure 3B:
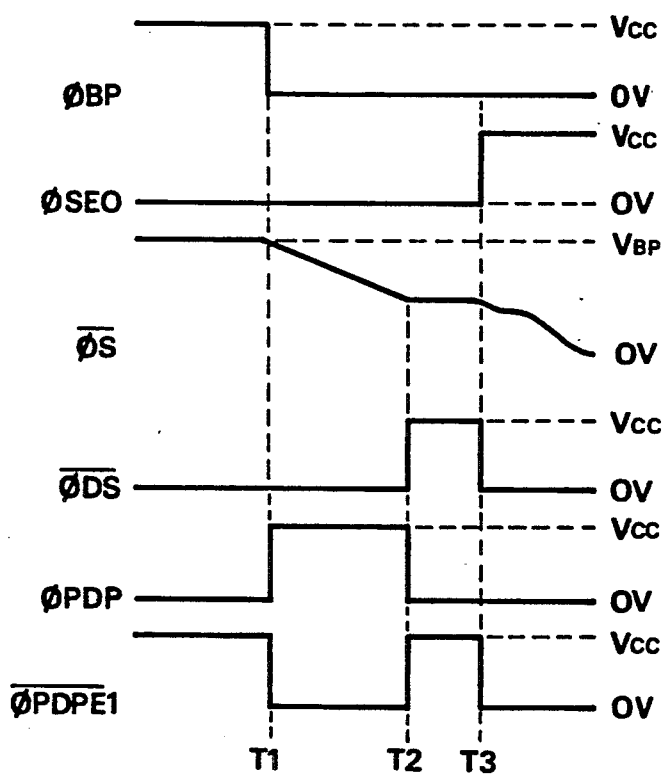
FIG. 3B is voltage wave forms for illustrating the operation of the example illustrated in FIG. 3A.

FIG. 3A illustrates an example of the present invention which will be described in conjunction with FIGS. 2A and 3B. In this example, referring again to FIG. 2B, before the time T2, the potential level of the $\overline{\phi S}$ node is decreased from the voltage (for example, VBP, Vcc/2) stored in the 0-bit line B0 to the voltage which is lower than that of the threshold voltage of the N-MOSFET Q6 of the N-channel sensing amplifying unit 3A of the sense amplifier 3, thereby preventing the previous enabling of the sensing operation of the sense amplifier 3 from occurring before the signal voltage from the selected memory cell of the memory cell array apparatus 1 is transferred to the 0-bit line B0.

The structure of the example of the present invention will be described.

A Schmitt trigger circuit 20 connected to the $\overline{\phi S}$ node of the sense amplifier 3, illustrated in FIG. 1, with the output terminal of the Schmitt trigger circuit 20 being, again, connected to the $\overline{\phi S}$ node via the latching circuit 10 is provided. On the other hand, the Schmitt trigger circuit 20 is connected, through the junction P9 illustrated in FIG. 2A, to the gate electrode of the P-MOSFET Q21 in order to receive the latching control signal $\phi$PDP.

The operation of the Schmitt trigger circuit will be described in conjunction with FIG. 2A, 3A and 3B. When the various control signals obtain each the respective potential state, as shown in FIG. 3B and the potential level of the $\overline{\phi S}$ node level, which is lower than that of the threshold voltage of the N-MOSFET Q6 of the sense amplifier 3, is sensed at the $\overline{\phi S}$ node by the Schmitt trigger circuit 20, the output signal $\overline{\phi DS}$ of the schmitt trigger circuit 20 becomes a logic "high" level signal for the time interval T2 to T3 in FIG. 3B to thereby supply the signal to the gate electrode of the N-MOSFET Q14 of the latching circuit 10 illustrated in FIG. 2A. Accordingly, if the N-MOSFET Q14 turns on, N-MOSFET Q19 turns then off, so that the $\overline{\phi S}$ potential does not decrease during the time interval T2 to T3. After the time interval T2 to T3, if the control signal $\phi$SE0 becomes a logic "high" level and the output signal $\overline{\phi DS}$ of the Schmitt trigger circuit 20 becomes a logic "low" level, the N-MOSFET Q19 turns on. Accordingly, the desirous sensing operation of the sense amplifier 3 is accomplished so that the misfunction of the sense amplifier 3 can be avoided.

Thus, according to the present invention, after the sensing operation of the sense amplifier is active, since the desired time for decreasing the potential level of the $\phi$S node of the latching circuit from the bit line charging potential level VBP to the threshold voltage level mentioned above can be reduced, the bit line sensing operation can be accomplished very rapidly so that an excellent effect of increasing the sensing ability of the sense amplifier can be obtained.

Furthermore, it should be noted that since all the control signals illustrated in connection with FIGS. 1B, 2B and 2C, that is, the bit line charging control signal $\phi$BP, and a plurality of the latching control signals $\phi$SE, $\phi$SE0, $\phi$SE1, $\phi$PDP, $\overline{\phi PDPE1}$ and $\overline{\phi PDPE2}$ are, respectively, provided with the prior art control signal sources, with each having a different time sequence relative to each other as shown in the drawings, the detailed description of the structure of the prior art control signal sources are not present herein in order to avoid unnecessary complexity.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A latching circuit for sense amplifier in a DRAM in which the DRAM comprises a bit line charging voltage source for supplying a bit line charging voltage; an equivalent circuit for making a 0-bit line B0 level and 1-bit line B1 level the same; a memory cell array apparatus including a plurality of memory cells arranged therein and a 0-bit line B0 and 1-bit line B1 formed therein; a sense amplifier provided with a N-channel sense amplifying unit having a $\overline{\phi S}$ node, which is connected from the 0-bit line B0 and a P-channel sense amplifying unit having a $\phi$R node, which is connected from the 1-bit line B1, for sensing data signal corresponding to a memory cell selected from a plurality of the memory cells; a MOSFET Q10 having a drain electrode connected to the φR node, a source electrode connected to a voltage source Vcc, and a gate electrode connected to receive a latching control signal φSP; a MOSFET Q12 having a drain electrode connected to the $\overline{\phi S}$ node, a source electrode connected to the φR node of the P-channel sense amplifying unit, and a gate electrode connected to receive a bit line charging control signal φBP; a MOSFET Q5 having a source electrode connected to the φR node, a drain electrode connected to the bit line charging voltage source, and a gate electrode connected to receive the bit line charging control signal φBP; and a latching means for sense amplifier connected to the $\overline{\phi S}$ node for decreasing the potential level at the φS node to the potential level of a ground, when a sense operation is enabled, wherein the improvement of the latching means for sense amplifier in order to gradually decrease the potential level at said $\overline{\phi S}$ node from the potential level which is lower than that of said bit line charging voltage to the potential level of said ground comprises:

a MOSFET Q20 having a drain electrode connected, through a junction P1, to said $\overline{\phi S}$ node of said N-channel sense amplifying unit, a source electrode connected to said ground, and a gate electrode connected to receive latching control signal φSE1;

a MOSFET Q18 having a drain electrode connected, through a junction P2 and said junction P1, to said $\overline{\phi S}$ node of said N-channel sense amplifying unit, a source electrode connected to a junction P4, and a gate electrode connected to a junction P3;

a MOSFET Q19 having a drain electrode connected to said junction P4, thereby connecting said MOSFETs Q18 and Q19 in series, a source electrode connected to said ground, and a gate electrode connected to a junction P6;

a MOSFET Q15 having a drain electrode connected, through said junctions P2 and P1, to said $\overline{\phi S}$ node of said N-channel sense amplifying unit, a source electrode connected to said junction P3, and a gate electrode connected to a junction P8;

a MOSFET Q17 having a drain electrode connected to a junction P5 which is connected to said junction P4, a source electrode connected to said junction P6, and a gate electrode connected to said junction P8;

a MOSFET Q16 having a drain electrode connected to said bit line charging voltage source, a source electrode connected to said junction P5, and a gate electrode connected through a NOT gate G1 to receive a latching control signal $\overline{\phi PDPE2}$;

a MOSFET Q21 having a drain electrode connected to said voltage source Vcc, a source electrode connected to said junction P3, and a gate electrode connected, through a junction P9 which is connected to said junctions P8, to receive a latching control signal φPDP such that, in use, said MOSFET Q15 and Q17 or Q21 turn on or off depending upon said latching control signal φPDP being applied to their gate electrodes;

a MOSFET Q13 having a drain electrode connected to said voltage source Vcc, a source electrode connected to a junction P7 which is connected to said junction P6, and a gate electrode connected through a NOT gate G2 to receive a latching control signal φSE0 such that, in use, said MOSFET Q13 and Q16 turning on or off depending upon said latching control signal φSE0 and said latching control signal $\overline{\phi PDPE2}$ being, respectively, applied through each said respective NOT gate G2 and G1 to their gate electrodes; and, a MOSFET Q14 having a drain electrode connected to said junction P7, a source electrode connected to said ground, and a gate electrode connected to receive a latching control signal $\overline{\phi PDPE1}$ such that, in use, said each MOSFET Q14 and Q20 turning on or off depending upon said latching control signal $\overline{\phi PDPE1}$ and said latching control signal φSE1 being, respectively, applied to their gate electrodes.

2. The latching circuit for sense amplifier of claim 1, wherein said MOSFETs Q5, Q12, Q14, Q15, Q17, Q18, Q19 and Q20 are N-channel MOSFETs.

3. The latching circuit for sense amplifier of claim 1, wherein said MOSFETs Q10, Q13, Q16 and Q21 are P-channel MOSFETs.

4. The latching circuit for sense amplifier of claim 1, wherein said latching means further comprises:

a Schmitt trigger circuit having two inputs, with one input connected to said $\overline{\phi S}$ node of N-channel sense amplifying unit and other input connected via said junction P9 to said gate electrode of said MOSFET Q21 to receive said latching control signal φPDP, and an output connected to said gate electrode of said MOSFET Q14 to supply an output signal $\overline{\phi DS}$ of said Schmitt trigger circuit to said MOSFET Q14, thereby preventing the previous enabling of the sensing operation of said sense amplifier from occurring before data signal from said selected memory cell of said memory cell array apparatus is transferred to said 0-bit line B0.

5. A latching circuit for sense amplifier in a DRAM in which the DRAM comprises a bit line charging voltage source for supplying a bit line charging voltage; an equivalent circuit for making a 0-bit line B0 level and 1-bit line B1 level the same; a memory cell array apparatus including a plurality of memory cells arranged therein and a 0-bit line B0 and 1-bit line B1 formed therein; a sense amplifier provided with a N-channel sense amplifying unit having a $\overline{\phi S}$ node, which is connected from the 0-bit line B0 and a P-channel sense amplifying unit having a φR node, which is connected from the 1-bit line B1, for sensing data signal corresponding to a memory cell selected from a plurality of the memory cells; a MOSFET Q10 having a drain electrode connected to the φR node, a source electrode connected to a voltage source Vcc, and a gate electrode connected to receive a latching control signal φSP; a MOSFET Q12 having a drain electrode connected to the $\overline{\phi S}$ node, a source electrode connected to the φR node of the P-channel sense amplifying unit, and a gate electrode connected to receive a bit line charging control signal φBP; a MOSFET Q5 having a source electrode connected to the φR node, a drain electrode connected to the bit line charging voltage source, and a gate electrode connected to receive the bit line charging control signal ,φBP; and a latching means for sense amplifier connected to the $\overline{\phi S}$ node for decreasing the potential level at the $\overline{\phi S}$ node to the potential level of a ground, when a sense operation is enabled, wherein the improvement of the latching means for sense amplifier in order to gradually decrease the potential level at said $\overline{\phi S}$ node from the potential level which is lower than that of said bit line charging voltage to the potential level of said ground comprises:

a MOSFET Q20 having a drain electrode connected, through a junction P1, to said $\overline{\phi S}$ node of said N-channel sense amplifying unit, a source electrode connected to said ground, and a gate electrode connected to receive latching control signal $\phi SE1$;

a MOSFET Q18 having a drain electrode connected, through a junction P2 and said junction P1, to said $\overline{\phi S}$ node of said N-channel sense amplifying unit, a source electrode connected to a junction P4, and a gate electrode connected to a junction P3;

a MOSFET Q19 having a drain electrode connected to said junction P4, thereby connecting said MOSFETs Q18 and Q19 in series, a source electrode connected to said ground, and a gate electrode connected to a junction P6;

a MOSFET Q15 having a drain connected, through said junctions P2 and P1, to said $\overline{\phi S}$ node of said N-channel sense amplifying unit, a source electrode connected to said junction P3, and a gate electrode connected to a junction P8;

a MOSFET Q17 having a drain electrode connected to a junction P5 which is connected to said junction P4, a source electrode connected to said junction P6, and a gate electrode connected to said junction P8;

a MOSFET Q16 having a drain electrode connected to said bit line charging voltage source, a source electrode connected to said junction P5, and a gate electrode connected through a NOT gate G1 to receive a latching control signal $\overline{\phi PDPE2}$;

a MOSFET Q21 having a drain electrode connected to said voltage source Vcc, a source electrode connected to said junction P3, and a gate electrode connected, through a junction P9 which is connected to said junctions P8, to receive a latching control signal $\phi PDP$ such that, in use, said MOSFET Q15 and Q17 or Q21 turn on or off depending upon said latching control signal $\phi PDP$ being applied to their gate electrodes;

a MOSFET Q13 having a drain electrode connected to said voltage source Vcc, a source electrode connected to a junction P7 which is connected to said junction P6, and a gate electrode connected through a NOT gate G2 to receive a latching control signal $\phi SE0$ such that, in use, said MOSFET Q13 and Q16 turning on or off depending upon said latching control signal $\phi SE0$ and said latching control signal $\overline{\phi PDPE2}$ being, respectively, applied through each said respective NOT gate G2 and G1 to their gate electrodes;

a MOSFET Q14 having a drain electrode connected to said junction P7, a source electrode connected to said ground, and a gate electrode connected to receive a latching control signal $\overline{\phi PDPE1}$ such that, in use, said each MOSFET Q14 and Q20 turning on or off depending upon said latching control signal $\overline{\phi PDPE1}$ and said latching control signal $\phi SE1$ being, respectively, applied to their gate electrodes; and, a Schmitt trigger circuit having two inputs, with one input connected to said $\overline{\phi S}$ node of N-channel sense amplifying unit and other input connected via said junction P9 to said gate electrode of said MOSFET Q21 to receive said latching control signal $\phi PDP$, and an output connected to said gate electrode of said MOSFET Q14 to supply an output signal $\phi DS$ of said Schmitt trigger circuit to said MOSFET Q14, thereby preventing the previous enabling of the sensing operation of said sense amplifier from occurring before data signal from said selected memory cell of said memory cell array apparatus is transferred to said 0-bit line B0.

6. The latching circuit for sense amplifier of claim 5, wherein said MOSFETs Q5, Q12, Q14, Q15, Q17, Q18, Q19 and Q20 are N-channel MOSFETs.

7. The latching circuit for sense amplifier of claim 5, wherein said MOSFETs Q10, Q13, Q16 and Q21 are P-channel MOSFETs.

8. A DRAM which includes a latching circuit for sense amplifier, comprising:

a bit line charging voltage source for supplying a bit line charging voltage;

an equivalent circuit for controlling a 0-bit line B0 level and a 1-bit line B1 level such that said levels are the same in response to a bit line charging control signal $\phi BP$ applied thereto;

a memory cell array apparatus including a plurality of memory cells arranged therein and a 0-bit line B0 and 1-bit line B1 formed therein;

a sense amplifier provided with a N-channel sense amplifying unit having a $\overline{\phi S}$ node, which is connected from said 0-bit line B0 of said memory cell array apparatus and a P-channel sense amplifying unit having a $\phi R$ node, which is connected from said 1-bit line B1 thereof, for sensing data signal corresponding to a memory cell selected from said plurality of memory cells arranged in said memory cell array apparatus;

a MOSFET Q10 having a drain electrode connected to said $\phi R$ node, a source electrode connected to a voltage source Vcc, and a gate electrode connected to receive a latching control signal $\phi SP$;

a MOSFET Q12 having a drain electrode connected to said $\overline{\phi S}$ node, a source electrode connected to said $\phi R$ node of said P-channel sense amplifying unit, and a gate electrode connected to receive said bit line charging control signal $\phi BP$;

a MOSFET Q5 having a source electrode connected to said $\phi R$ node, a drain electrode connected to said bit line charging voltage source, and a gate electrode connected to receive said bit line charging control signal $\phi BP$;

a latching means for sense amplifier connected to $\overline{\phi S}$ node for gradually decreasing the potential level at said $\overline{\phi S}$ node from the potential level which is lower than that of said bit line charging voltage to the potential level of a ground, when a sense operation is enabled, said latching means for sense amplifier including:

a MOSFET Q20 having a drain electrode connected, through a junction P1, to said $\overline{\phi S}$ node of said N-channel sense amplifying unit, a source electrode connected to said ground, and a gate electrode connected to receive latching control signal $\phi SE1$;

a MOSFET Q18 having a drain electrode connected through a junction P2 and said junction P1, to said $\overline{\phi S}$ node of said N-channel sense amplifying unit, a source electrode connected to a junction P4, and a gate electrode connected to a junction P3;

a MOSFET Q19 having a drain electrode connected to said junction P4, thereby connecting said MOSFETs Q18 and Q19 in series, a source electrode connected to said ground, and a gate electrode connected to a junction P6;

a MOSFET Q15 having a drain electrode connected, through said junctions P2 and P1, to said $\overline{\phi S}$ node of said N-channel sense amplifying unit, a source electrode connected to said junction P3, and a gate electrode connected to a junction P8;

a MOSFET Q17 having a drain electrode connected to a junction P5 which is connected to said junction P4, a source electrode connected to said junction P6, and a gate electrode connected to said junction P8;

a MOSFET Q16 having a drain electrode connected to said bit line charging voltage source, a source electrode connected to said junction P5, and a gate electrode connected through a NOT gate G1 to receive a latching control signal $\overline{\phi PDPE2}$;

a MOSFET Q21 having a drain electrode connected to said voltage source Vcc, a source electrode connected to said junction P3, and a gate electrode connected, through a junction P9 which is connected to said junctions P8, to receive a latching control signal $\phi PDP$ such that, in use, said MOSFET Q15 and Q17 or Q21 turn on or off depending upon said latching control signal $\phi PDP$ being applied to their gate electrodes;

a MOSFET Q13 having a drain electrode connected to said voltage source Vcc, a source electrode connected to a junction P7 which is connected to said junction P6, and a gate electrode connected through a NOT gate G2 to receive a latching control signal $\phi SE0$ such that, in use, said MOSFET Q13 and Q16 turning on or off depending upon said latching control signal $\phi SE0$ and said latching control signal $\overline{\phi PDPE2}$ being, respectively, applied through each said respective NOT gate G2 and G1 to their gate electrodes;

a MOSFET Q14 having a drain electrode connected to said junction P7, a source electrode connected to said ground, and a gate electrode connected to receive a latching control signal $\overline{\phi PDPE1}$ such that, in use, said each MOSFET Q14 and Q20 turning on or off depending upon said latching control signal $\overline{\phi PDPE1}$ and said latching control signal $\phi SE1$ being, respectively, applied to their gate electrodes; and, a Schmitt trigger circuit having two inputs, with one input connected to said $\overline{\phi S}$ node of N-channel sense amplifying unit and other input connected via said junction P9 to said gate electrode of said MOSFET Q21 to receive said latching control signal $\phi PDP$, and an output connected to said gate electrode of said MOSFET Q14 to supply an output signal $\overline{\phi DS}$ of said Schmitt trigger circuit to said MOSFET Q14, thereby preventing the previous enabling of the sensing operation of said sense amplifier from occurring before data signal from said selected memory bell of said memory cell array apparatus is transferred to said 0-bit line B0.

9. The DRAM which includes a latching circuit for sense amplifier of claim 8 wherein said MOSFETs Q5, Q12, Q14, Q15, Q17, Q18, Q19 and Q20 are N-channel MOSFETs.

10. The DRAM which includes a latching circuit for sense amplifier of claim 8, wherein said MOSFETs Q10, Q13, Q16 and Q21 are P-channel MOSFETs.

* * * * *

UNITED STATES PATENT AND TRADEMARK OFFICE
CERTIFICATE OF CORRECTION

PATENT NO. : 5,138,577          Page 1 of 2

DATED : August 11, 1992

INVENTOR(S) : Jong H. Oh

It is certified that error appears in the above-identified patent and that said Letters Patent is hereby corrected as shown below:

Column 2, line 41; "$\phi S$" should read --$\overline{\phi S}$--.

Column 5, line 38; "$\phi S$" should read --$\overline{\phi S}$--.

Column 6, line 21; "$\phi S$" should read --$\overline{\phi S}$--.

Column 7, line 13; "$\phi S$" should read --$\overline{\phi S}$--.

Column 7, line 15; "$\phi S$" should read --$\overline{\phi S}$--.

Column 7, line 20; "$\phi S$" should read --$\overline{\phi S}$--.

Column 8, line 31; "$\phi S$" should read --$\overline{\phi S}$--.

Column 9, line 16, claim 1; "$\phi S$" should read --$\overline{\phi S}$--.

Column 11, line 36, claim 5; "junctions" should read --junction--.

Column 12, line 37, claim 8; "$\phi S$" should read --$\overline{\phi S}$--.

Column 12, line 46, claim 8; "$\phi S$" should read --$\overline{\phi S}$--.

Column 12, line 48, claim 8; "$\phi S$" should read --$\overline{\phi S}$--.

UNITED STATES PATENT AND TRADEMARK OFFICE
CERTIFICATE OF CORRECTION

PATENT NO. : 5,138,577
DATED : August 11, 1992
INVENTOR(S) : Jong H. Oh

It is certified that error appears in the above-indentified patent and that said Letters Patent is hereby corrected as shown below:

Column 13, line 20, claim 8; "junctions" should read --junction--.

Signed and Sealed this

Eighth Day of February, 1994

Attest:

BRUCE LEHMAN

Attesting Officer  Commissioner of Patents and Trademarks